(12) United States Patent
Rao

(10) Patent No.: US 12,174,268 B2
(45) Date of Patent: Dec. 24, 2024

(54) SYSTEM AND METHOD FOR DETECTING A FAULTY CONNECTION IN AN EARTH GRID

(71) Applicant: JEF TECHNO SOLUTIONS PVT LTD, Bangalore (IN)

(72) Inventor: Prashanth Belur Gururaja Rao, Bangalore (IN)

(*) Notice: Subject to any disclaimer, the term of this patent is extended or adjusted under 35 U.S.C. 154(b) by 57 days.

(21) Appl. No.: 18/022,727

(22) PCT Filed: Oct. 18, 2021

(86) PCT No.: PCT/IN2021/050991
§ 371 (c)(1),
(2) Date: Feb. 22, 2023

(87) PCT Pub. No.: WO2022/097165
PCT Pub. Date: May 12, 2022

(65) Prior Publication Data
US 2023/0314532 A1 Oct. 5, 2023

(30) Foreign Application Priority Data
Nov. 3, 2020 (IN) .............................. 202041047863

(51) Int. Cl.
*G01R 31/54* (2020.01)

(52) U.S. Cl.
CPC .................................... *G01R 31/54* (2020.01)

(58) Field of Classification Search
CPC ..... G01R 1/06; G01R 1/067; G01R 31/31901
See application file for complete search history.

(56) References Cited

U.S. PATENT DOCUMENTS

| 10,193,384 B2* | 1/2019 | Brooks | H02J 3/00125 |
| 2006/0119368 A1* | 6/2006 | Sela | G01R 31/52 |
| | | | 324/522 |

* cited by examiner

Primary Examiner — Tung X Nguyen

(57) ABSTRACT

A system for detecting a faulty connection in an earth grid 104 is provided. The system includes a current injection device 102 to provide an input current with off grid frequency to the earth grid 104 through a reference riser 112. The riser under test 110 is connected with the earth grid 104 to receive the input current with off grid frequency and the earth grid 104. The system includes a first current measuring device that measures, at the riser under test 110, a first current that is received from the earth grid 104 and a second current measuring device that measures, at the riser under test 110, a second current that is received from the earth grid 104. The second current measuring device compares the first current and the second current to determine a faulty connection in the riser under test 110.

10 Claims, 4 Drawing Sheets

SYSTEM AND METHOD FOR DETECTING A FAULTY CONNECTION IN AN EARTH GRID

BACKGROUND

Technical Field

The embodiments herein generally relate to detection of a faulty connection in an earth grid, and more particularly, to a system and method for detecting the faulty connections in the earth grid using a current injection device and a current measuring device.

Description of the Related Art

In an electrical system, the grid connection from the electric substations is permanently buried under the ground and it is not easily accessible. The accident happens when people come in contact with equipment connected to the buried earth grid where such connections have breakage/damage. The breakage in the earth grid buried under the ground may cause major accident during the damage in the grid.

Existing system measures the ground neutral fault in live alternating current circuits by comparing voltage drops across portions of the circuit. The ratio of voltage drops of circuit portions are measured, which indicates the fault in the circuit.

The existing system gauges a damage in the earth grid (i.e. riser) by measuring the effective resistance between the earthing grid and an equipment. The drawback of the existing system is that it is not possible to identify which riser is defective and the riser is defective at the equipment or the earth grid.

As mentioned, there remains a need for a system or a method to detecting a faulty connection to the earth grid.

SUMMARY

In view of the foregoing, an embodiment herein provides a system for detecting a faulty connection in an earth grid. The system includes (i) a current injection device and (ii) a one or more current measuring devices (108). The one or more current measuring devices is connected to the riser under test. The current injection device includes (a) a frequency converter and (ii) a current unit. The frequency converter modifies an input current with grid frequency into an input current with off grid frequency. The current unit regulates the input current with off grid frequency into a variable input current with off grid frequency. The earth grid includes (i) a reference riser and (ii) a riser under test. The reference riser is electrically connected to the current injection device. The riser under test is connected to the earth gird, an equipment and one or more current measuring device. The reference riser receives the input current with off grid frequency from the current injection device and provides the input current with off grid frequency to the earth grid for detecting a faulty connection in the riser under test. The riser under test is connected to the earth gird, and an equipment. The one or more current measuring device includes a first current measuring device and a second current measuring device. The first current measuring device measures a first current that is received from the earth grid and the second current measuring device measures a second current that is received from a body of the equipment. The second current measuring device compares the first current, the second current and the input current and determines a faulty connection in the riser under test if at least one of (a) the second current is below the first current, (b) the first current is below the second current, or (c) the first current or the second current is zero.

The input current traverses through the earth grid back to the current injection device through a plurality of risers connected to the equipment.

In some embodiments, the input current that is injected to the earth grid (104) ranges from 1 ampere to 20 amperes. In some embodiments, the input current includes at least one of an AC current or a DC current. In some embodiments, the reference riser is a conductor that connects the current injection device and the earth grid. In some embodiments, the reference riser is a node taken from the earth grid to provide the input current from the current injection device to the earth grid.

In some embodiments, the riser under test is a conductor that is connected with (i) the equipment to receive the output current from the equipment and (ii) the earth grid to receive the output current from the earth grid. The output current from the equipment and the earth grid is provided to the current measuring device.

In an aspect, an embodiment herein provides a method for detecting a faulty connection in an earth grid. The method includes (i) modifying an input current with grid frequency into an input current with off grid frequency using a frequency converter, (ii) regulating the input current with off grid frequency into a variable input current with off grid frequency using a current unit, (iii) receiving, using a reference riser, the input current with off grid frequency from the current injection device and providing the input current with off grid frequency to the earth grid for detecting a faulty connection in a riser under test, (iv) measuring, at the riser under test, a first current that is received from the earth grid using a first current measuring device, (v) measuring, at the riser under test, a second current that is received from a body of an equipment using a second current measuring device, and (vi) comparing the first current, the second current and the input current with off grid frequency using the second current measuring device and determining a faulty connection in the riser under test if at least one of (a) the second current is below the first current, (b) the first current is below the second current, or (c) the first current or the second current is zero. The reference riser is electrically connected to the current injection device. The earth gird, the equipment, the first current measuring device and second current measuring device are connected to the riser under test.

In some embodiments, the riser under test is weakly connected to the equipment when the second current is below the first current. In some embodiments, the riser under test is weakly connected to the earth grid when the first current is below the second current. In some embodiments, the riser under test is open towards at least one of the earth grid or the equipment when the first current or the second current is zero. In some embodiments, the first and second currents are measured with an increased excitation voltage to determine an extent of weakness of the connection. In some embodiments, voltage drop is also measured along with the first and second currents to accurately determine a condition of the riser under test.

The system detects the faulty connection in the earth grid more accurately. The system may detect the faulty connection in the earth grid during the power flow in the earth grid or when the earth grid is in a working condition. The system provides low input current to the earth grid, thereby avoiding the damages in the equipment connected with the earth grid and avoid accidents while detecting the faulty connection. The low current can be provided to the earth grid even when the high current is passing through the earth grid without shutting down the high current in the earth grid. The low current with off grid frequency provided to the earth grid for detecting the faulty connection does not disturb the high current in the earth grid with grid frequency. When the faulty connection is detected, an area of the faulty connection below ground is excavated and the connection in the excavated area is repaired.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
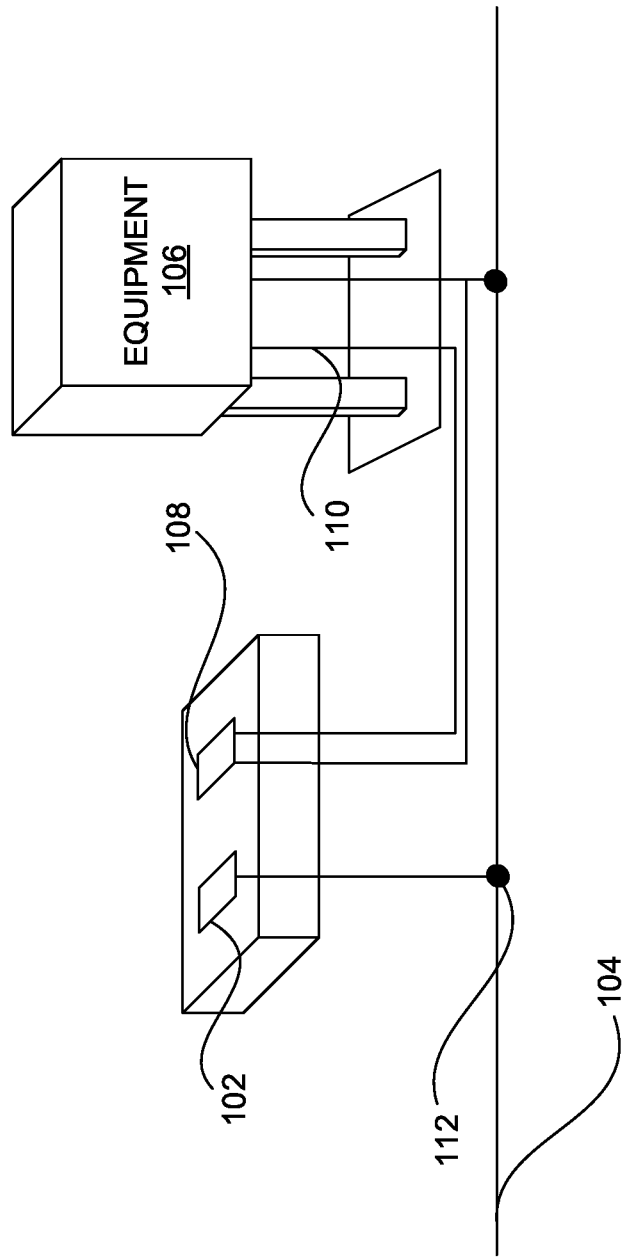
FIG. 1 is an exploded view of a system for detecting a faulty connection in a riser under test that is connected to an earth grid according to some embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a system and method to detect a faulty connection in a riser under test in the earth grid buried under the ground without shutting down the power that is supplied in the grid. The embodiments herein achieve this by providing a low input current to the earth grid to detect the faulty connection in the riser under test even when the high current is flown in the earth grid. Referring now to the drawings, and more particularly to FIGS. 1 to 4, where similar reference characters denote corresponding features consistently throughout the figures, preferred embodiments are shown.

FIG. 1 is an exploded view of a system for detecting a faulty connection in a riser under test that is connected to an earth grid using a current injection device according to some embodiments herein. The system includes a current injection device 102, and a current measuring device 108. The current injection device 102 is connected to an earth grid 104. The earth grid 104 includes a riser under test 110, and a reference riser 112. An equipment 106 is connected with the earth grid 104 to receive a current from electrical substations. In some embodiments, the current may be a grid current. In some embodiments, the earth grid 104 is buried under the earth to dissipate fault currents flowing in from above grade steel structures. In some embodiments, the current from the electrical substations flows to the equipment 106 through the earth grid 104. The equipment 106 may be any of: a fridge, a television, one or more lights, a grinder, motors, an oven and the like. In some embodiments, the equipment 106 connected with the earth grid 104 receives the current with low voltage due to some breakage in the earth grid 104. The system detects the faulty connection in the riser under test 110 that is connected to the earth grid 104 buried under the earth using the current injection device 102 and the current measuring device 108. In some embodiments, the earth grid 104 is made of at least one of copper or aluminium. The system detects the faulty connection in the riser under test 110 that is connected to the earth grid 104 without disturbing or shutting down the grid current.

The current injection device 102 is connected with the earth grid 104 to provide a low input current to detect the faulty connection in the riser under test 110 that is connected to the earth grid 104 buried under the earth without excavating. In some embodiments, the current injection device 102 receives an input current from an electrical grid connected with the substations. The current injection device 102 modifies the input current with a grid frequency received from the electrical grid into an input current with off grid frequency. The current injection device 102 regulates the input current with off grid frequency into a variable input current with off grid frequency. In some embodiments, the system includes a voltage regulator that is used to monitor a flow of the input current with off grid frequency and to regulate the voltage. In some embodiments, the voltage regulator includes a capacitor to regulate the voltage. The current injection device 102 provides the low input current with off grid frequency to the earth grid 104 through the reference riser 112. In some embodiments, the reference riser 112 is a connection between the current injection device 102 and the earth grid 104.

In some embodiments, a riser is a node taken from the earth grid 104 buried under the earth. In some embodiments, the reference riser 112 is the node taken from the earth grid 104 buried under the earth to provide the low input current with off grid frequency from the current injection device 102 to the earth grid 104. The equipment 106 is connected with the earth grid 104 to receive the input low current from the earth grid 104. In some embodiments, the low input current ranges from 1 ampere to 20 amperes. In some embodiments, the grid frequency and the off-grid frequency is different for providing the low input current to the earth grid 104 when the high grid current is flowing in the earth grid. The current measuring device 108 that is connected with the earth grid 104 is configured to measure a first current (e.g. an output current) that is received from the electrical grid. The current measuring device 108 that is connected with the equipment 106 is configured to measure a second current (e.g. an output current) that is received from the equipment 106. The current measuring device 108 is connected with the equipment 106 through the riser under test 110. In some embodiments, the riser under test 110 is a node taken from the earth grid 104 or a node taken from the equipment 106. In some embodiments, the riser under test 110 is connected with the equipment 106, the earth grid 104 and the current measuring device 108. The current measuring device 108 includes a first current measuring device and a second current measuring device. In some embodiments, the first current measuring device measures, at the riser under test 110, the first current that is received from the earth grid 104. In some embodiments, the second current measuring device measures, at the riser under test 110, the second current that is received from the body of the equipment 106.

The second current measuring device compares the first current with the second current, and the input current and determines a faulty connection in the riser under test 110. The faulty connection includes at least one of (i) the riser under test 110 that is weakly connected with the equipment 106, (ii) the riser under test 110 that is weakly connected to the earth grid 104, or (iii) the riser under test 110 that is open towards equipment 106 and the earth grid 104. The system detects that the riser under test 110 is weakly connected with the equipment 106 if the second current is below the first current. The system detects that the riser under test 110 is weakly connected with the earth grid 104 if the first current is below the second current. The system detects that the riser under test 110 is open towards the equipment 106 and the earth grid 104 if the second current or the first current is zero. In some embodiments, the first and second currents are measured with an increased excitation voltage to determine an extent of weakness of the connection. In some embodiments, voltage drop is also measured along with the first and second currents to accurately determine a condition of the riser under test.

Figure 2:
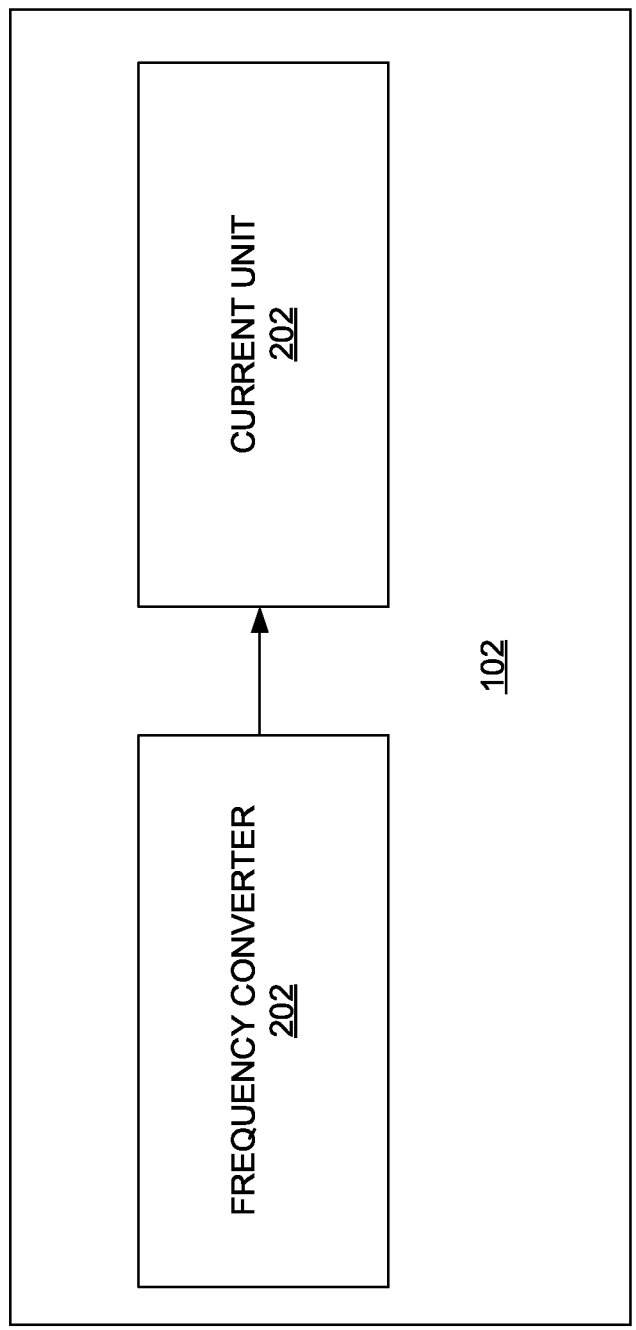
FIG. 2 is a block diagram of the current injection device of FIG. 1 that provides a low input current to the earth grid to detect a faulty connection in the riser under test that is connected to the earth grid according to some embodiments herein.

FIG. 2 is a block diagram of the current injection device 102 of FIG. 1 that provides the low input current to the earth grid 104 to detect a faulty connection in the riser under test 110 that is connected to the earth grid 104 according to some embodiments herein. The current injection device 102 includes a frequency converter 202 and a current unit 204. The frequency converter 202 receives an input current from an electrical grid connected with electrical substations. In some embodiments, the input current received from the electrical grid is in the grid frequency. The frequency converter 202 modifies the input current with grid frequency into the input current with off-grid frequency. In some embodiments, the grid frequency is modified into the off-grid frequency to provide the input current with off-grid frequency into the earth grid 104 even when the high current is flown in the earth grid 104. The output from the frequency converter 202 is provided to the current unit 204. The current unit 204 regulates the input current with off-grid frequency into the variable input current with off grid frequency. The input current may be varied between a range of 1 ampere to 20 amperes. In some embodiments, the input current with off grid frequency is regulated based on the grid current with grid frequency passing in the earth grid 104. In some embodiments, the regulated input current is provided to the earth grid 104 through the reference riser 112.

Figure 3:
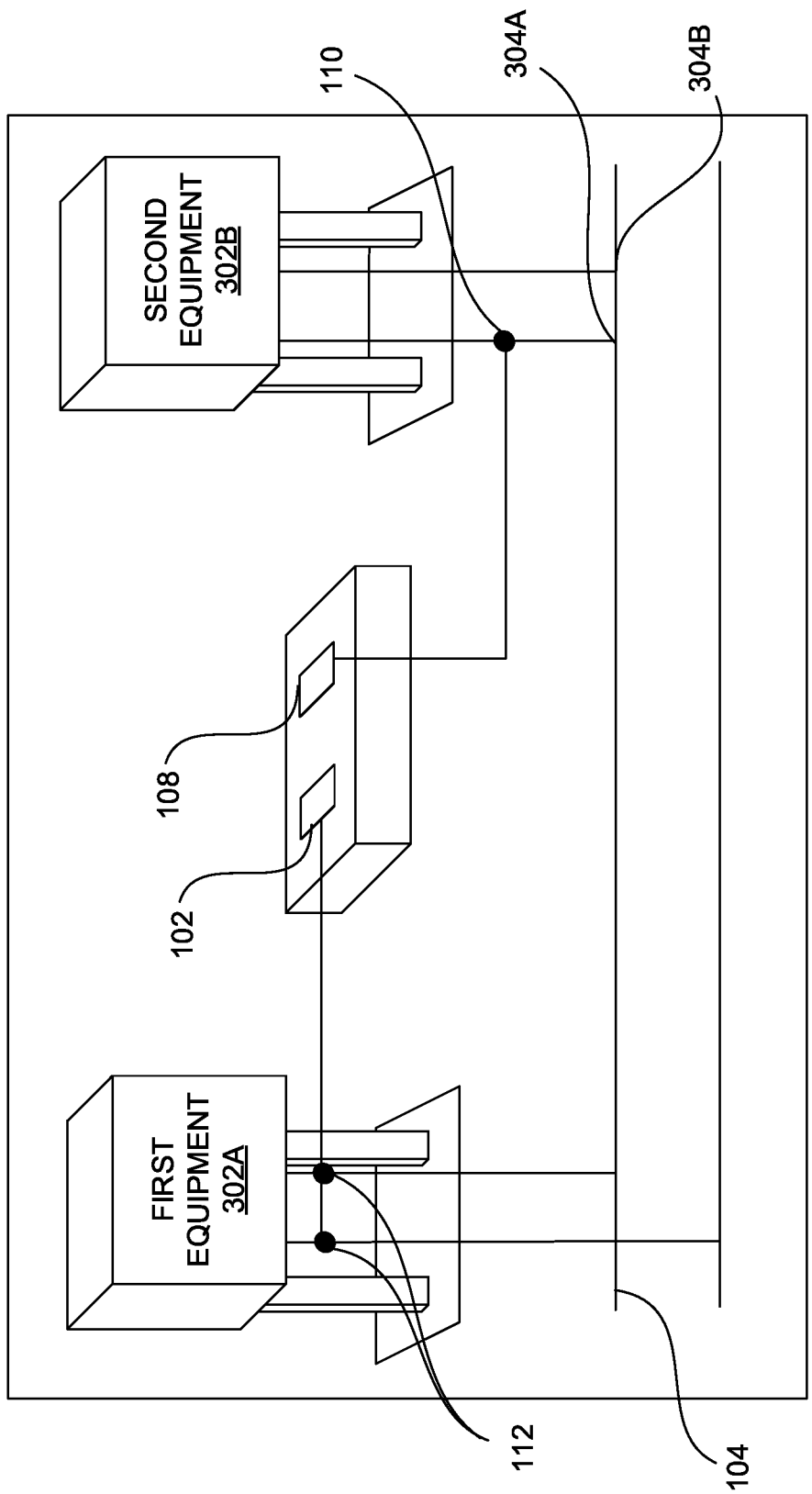
FIG. 3 is an exemplary view of the system for detecting a faulty connection in the riser under test that is connected between one or more equipment's and the earth grid of FIG. 1 according to some embodiments herein.

FIG. 3 is an exemplary view of the system for detecting a faulty connection in the riser under test 110 that is connected between one or more equipment's 302A-B and the earth grid 104 of FIG. 1 according to some embodiments herein. The system includes the current injection device 102, and the current measuring device 108, The earth grid 104 includes a reference riser 112, the riser under test 110, a first node 304A and a second node 304B. The earth grid 104 is electrically connected to a first equipment 302A, a second equipment 302B. The system detects a faulty connection in the riser under test 110 that is connected between the second equipment 302B and the earth grid 104 with the help of the current injection device 102 and the current measuring device 108. The current injection device 102 provides the low input current with off grid frequency to the first equipment 302A through the reference riser 112. The second equipment 302B is electrically connected with the earth grid 104 to receive the input current with off grid frequency. The current measuring device 108 includes a first current measuring device and a second current measuring device. The first current measuring device is connected with the riser under test 110 and measures the first current received from the earth grid 104 at the riser under test 110. The second current measuring device is connected with the riser under test 110 and measures the second current received from the earth grid 104, at the riser under test 110. The second current measuring device compares the first current with the second current for detecting the faulty connection in the riser under test 110.

In a first scenario, the riser under test 110 is in the first node 304A. The first current measuring device is connected with the riser under test 110 and measure, at the riser under test 110, the first current that is received from the earth grid 104. The second current measuring device is connected with the riser under test 110 and measures the second current received from the earth grid 104 equipment 302A, at the riser under test 110.

In a second scenario, the riser under test 110 is in the second node 304B. The first current measuring device is connected with the riser under test 110 and measures, at the riser under test 110, the first current that is received from the earth grid 104. The second current measuring device is connected with the riser under test 110 and measures, at the riser under test 110, the second current received from the second equipment 302B.

The second current measuring device compares the first current with the second current to detect a faulty connection in the riser under test 110. In some example embodiments, the current injection device provides the low current with 10 amperes as an input to the earth grid 104 through the reference riser 112. In some example embodiments, the first current measuring device measures 5 amperes current from the riser under test 110 and the second current measuring device measures 5 amperes current from the riser under test 110 when the riser under test 110 is in good condition.

In some embodiments, the system detects a good connection in the riser under test 110 when the first current and the second current is equal. In some example embodiments, the system detects that the riser under test 110 is damaged partially when the first current measuring device measures 3 amperes current from the riser under test 110 and the second current measuring device measures 7 amperes current from the riser under test 110. In some embodiments, the system detects a faulty connection in the riser under test 110 when the first current is below the second current.

In some example embodiments, the system detects that the riser under test 110 is open when the first current measuring device measures 0 ampere from the riser under test 110 and second current measuring device measures 10 amperes from the riser under test 110. In some embodiments, the system detects that the riser under test 110 between the earth grid 104 and the second equipment 302B is open when the first current is zero. In some embodiments, the first and second currents are measured with an increased excitation voltage to determine an extent of weakness of the connection. In some embodiments, voltage drop is also measured along with the first and second currents to accurately determine a condition of the riser under test.

Figure 4:
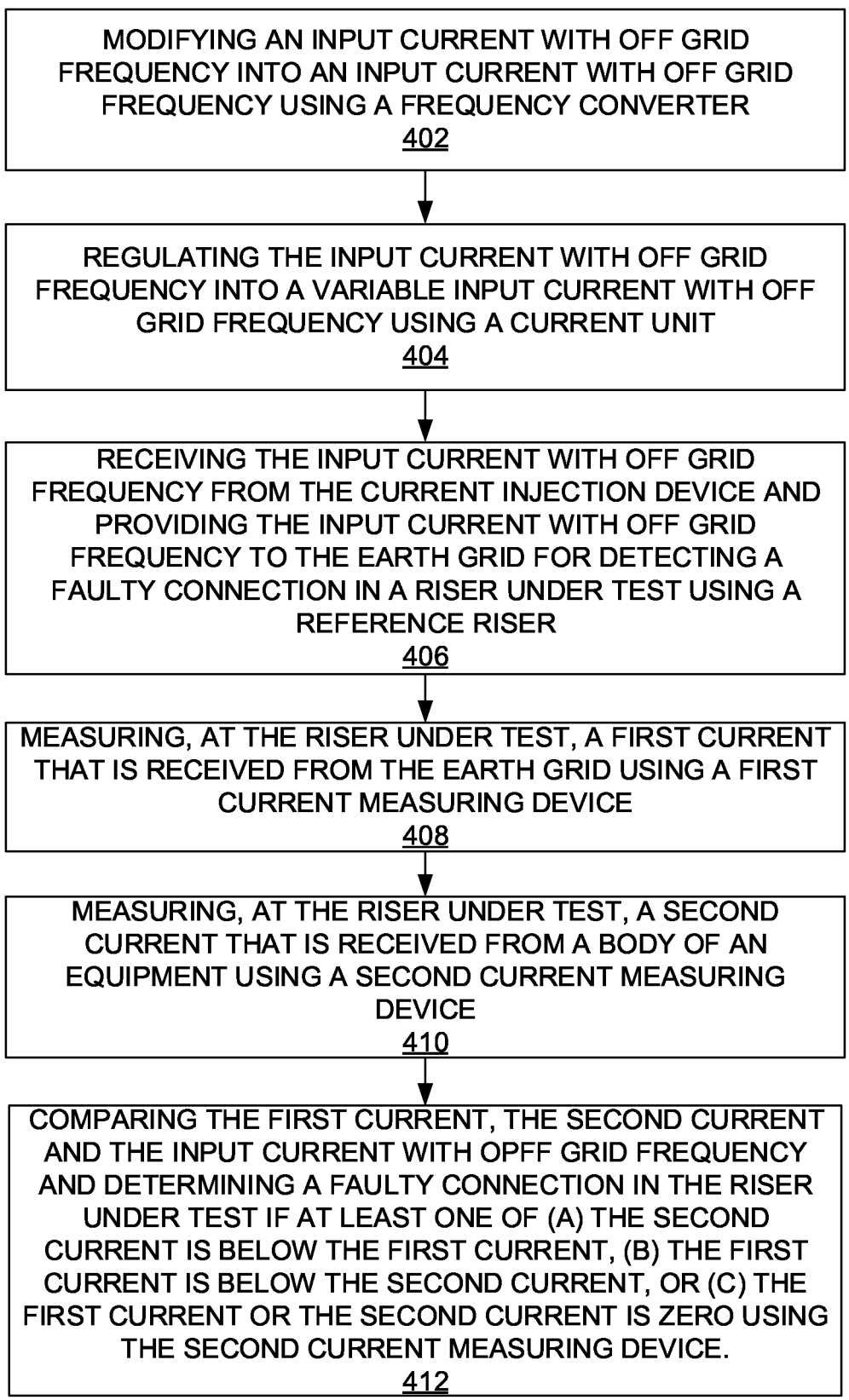
FIG. 4 is a flow diagram that illustrates a method for detecting a faulty connection in the riser under test 110 that is connected to the earth grid using the system of FIG. 1 according to some embodiments herein.

FIG. 4 is a flow diagram that illustrates a method of detecting a faulty connection in the riser under test 110 that is connected to the earth grid 104 using the system of FIG. 1 according to some embodiments herein. At step 402, the low input current with off grid frequency is modified into an input current with off grid frequency using a frequency converter. At step 404, the input current with off grid frequency is regulated into a variable input current with off grid frequency using a current unit 204. At step 406, the input current with off grid frequency from the current injection device 102 is received and the input current to the earth grid is provided for detecting a faulty connection in a riser under test using a reference riser. At step 408, a first current that is received from the earth grid is measured at the riser under test using a first current measuring device. At step 410, a second current that is received from a body of an equipment is measured at the riser under test using a second current measuring device. At step 412, the first current, the second current and the input current is compared and a faulty connection in the riser under test is determined if at least one of (a) the second current is below the first current, (b) the first current is below the second current, or (c) the first current or the second current is zero using the second current measuring device.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

I claim:

1. A system for detecting a faulty connection in an earth grid (104), wherein the system comprises:
   a current injection device (102) comprises:
      a frequency converter (202) that modifies an input current with grid frequency into an input current with off grid frequency; and
      a current unit (204) that regulates the input current with off grid frequency into a variable input current with off grid frequency;
   wherein the earth grid (104) that comprises:
      a reference riser (112) that is electrically connected to the current injection device (102), wherein the reference riser (112) receives the input current with off grid frequency from the current injection device (102) and provides an input current with off grid frequency to the earth grid (104) for detecting a faulty connection in a riser under test (110); and
      the riser under test (110) that is connected to the earth gird (104), and an equipment; and
   a plurality of current measuring devices (108) that is connected to the riser under test (110), wherein the plurality of current measuring device (108) comprises a first current measuring device and a second current measuring device, wherein the first current measuring device measures a first current that is received from the earth grid (104) and the second current measuring device measures a second current that is received from a body of the equipment (106),
   wherein the second current measuring device compares the first current, the second current and the input current and determines the faulty connection in the riser under test (110) if at least one of (a) the second current is below the first current, (b) the first current is below the second current, or (c) the first current or the second current is zero.

2. The system as claimed in claim 1, wherein the input current that is injected to the earth grid (104) ranges from 1 ampere to 20 amperes.

3. The system as claimed in claim 1, wherein the input current comprises at least one of an AC current or a DC current.

4. The system as claimed in claim 1, wherein the reference riser (112) is a conductor that connects the current injection device (102) and the earth grid (104).

5. The system as claimed in claim 1, wherein the reference riser (112) is a node taken from the earth grid (104) to provide the input current from the current injection device (102) to the earth grid (104).

6. The system as claimed in claim 1, wherein the riser under test (110) is a conductor that is connected with (i) the equipment (106) to receive the output current from the equipment and (ii) the earth grid (104) to receive the output current from the earth grid (104), wherein the output current from the equipment (106) and the earth grid (104) is provided to the current measuring device.

7. A method for detecting a faulty connection in an earth grid (104), wherein the method comprises:
   modifying, using a frequency converter (202), an input current with grid frequency into an input current with off grid frequency;
   regulating, using a current unit (204), the input current with off grid frequency into a variable input current with off grid frequency;
   receiving, using a reference riser (112), the input current with off grid frequency from the current injection device (102) and providing the input current with off grid frequency to the earth grid (104) for detecting a faulty connection in a riser under test (110), wherein the reference riser (112) is electrically connected to the current injection device (102);
   measuring, at the riser under test (110), using a first current measuring device, a first current that is received from the earth grid (104);
   measuring, at the riser under test (110), using a second current measuring device, a second current that is received from a body of an equipment (106), wherein the earth gird (104), the equipment (106), the first current measuring device and the second current measuring device are connected to the riser under test (110);
   comparing, using the second current measuring device, the first current, the second current and the input current with off grid frequency to determine the faulty connection in the riser under test (110) if at least one of (a) the second current is below the first current, (b) the first current is below the second current, or (c) the first current or the second current is zero.

8. The method as claimed in claim 7, wherein the riser under test (110) is weakly connected to the equipment (106) when the second current is below the first current.

9. The method as claimed in claim 7, wherein the riser under test (110) is weakly connected to the earth grid (104) when the first current is below the second current.

10. The method as claimed in claim 7, wherein the riser under test (110) is open towards at least one of the earth grid (104) or the equipment (106) when the first current or the second current is zero.

\* \* \* \* \*